United States Patent
Donohoe

(10) Patent No.: US 7,114,532 B2
(45) Date of Patent: *Oct. 3, 2006

(54) LINER FOR USE IN PROCESSING CHAMBER

(75) Inventor: Kevin G. Donohoe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/851,076

(22) Filed: May 24, 2004

(65) Prior Publication Data

US 2005/0011454 A1    Jan. 20, 2005

Related U.S. Application Data

(60) Continuation of application No. 10/095,441, filed on Mar. 13, 2002, now Pat. No. 6,739,360, which is a division of application No. 09/765,381, filed on Jan. 22, 2001, now Pat. No. 6,374,871, which is a continuation of application No. 09/317,629, filed on May 25, 1999, now Pat. No. 6,234,219.

(51) Int. Cl.
  *B65B 1/20* (2006.01)

(52) U.S. Cl. .............. 141/11; 141/1; 141/85; 141/98; 118/715; 156/345.48

(58) Field of Classification Search ............ 141/1, 141/11, 63–70, 85, 89, 91, 98; 206/454, 206/455, 832; 118/715, 723 E, 723 I, 723 IR, 118/723 VE; 414/288, 292, 217.1, 331.01; 264/101, 102, 313; 425/405.1, 389; 156/345.48
See application file for complete search history.

(56) References Cited

U.S. PATENT DOCUMENTS

| | | | |
|---|---|---|---|
| 4,532,970 A | 8/1985 | Tullis et al. | |
| 4,739,882 A | 4/1988 | Parikh et al. | |
| 5,444,923 A | 8/1995 | Romm et al. | |
| 5,527,390 A | 6/1996 | Ono et al. | |
| 5,586,585 A | 12/1996 | Bonora et al. | |
| 5,607,276 A | 3/1997 | Muka et al. | |
| 5,628,683 A | 5/1997 | Gentischer | |
| 5,752,796 A | 5/1998 | Muka | |
| 5,772,770 A | 6/1998 | Suda et al. | |
| 5,772,946 A * | 6/1998 | Kaminaga et al. | 264/313 |
| 5,810,062 A | 9/1998 | Bonora et al. | |
| 5,879,458 A | 3/1999 | Roberson, Jr. et al. | |
| 5,992,346 A | 11/1999 | Straemke | |
| 6,042,651 A | 3/2000 | Roberson et al. | |
| 6,070,599 A * | 6/2000 | Ghanayem et al. | 134/1.3 |
| 6,234,219 B1 | 5/2001 | Donohoe | |
| 6,374,871 B1 | 4/2002 | Donohoe | |
| 6,739,360 B1 | 5/2004 | Donohoe | |

* cited by examiner

*Primary Examiner*—Timothy L. Maust
(74) *Attorney, Agent, or Firm*—Dickstein Shapiro LLP

(57) ABSTRACT

A container for use in a processing chamber to lessen the amount of contaminant particles found within the chamber after processing. The container fits closely within the chamber and includes ports for a gas conduit and a vacuum conduit. The container may be locked to the chamber through a locking mechanism and a recess in the container. The container may be guided into the chamber with a plurality of chamfers. The container may be used in inductively coupled plasma chambers, electron cyclotron resonance chambers, and chambers capable of receiving microwaves.

11 Claims, 8 Drawing Sheets

LINER FOR USE IN PROCESSING CHAMBER

This is a continuation application of U.S. patent application Ser. No. 10/095,441, filed on Mar. 13, 2002, now U.S. Pat. No. 6,739,360, which is a divisional of U.S. patent application Ser. No. 09/765,381, filed on Jan. 22, 2001, now U.S. Patent No. 6,374,871, which is a continuation of U.S. patent application Ser. No. 09/317,629, filed on May 25, 1999, now U.S. Pat. No. 6,234,219, all of which are hereby incorporated in their entirety by reference.

FIELD OF THE INVENTION

The present invention relates to the processing of work pieces used in semiconductor fabrication. More particularly, the present invention relates to a reusable container, or liner, for use in a work piece plasma processing chamber.

BACKGROUND OF THE INVENTION

A plasma is a collection of electrically charged and neutral particles. In a plasma, the density of negatively-charged particles (electrons and negative ions) is equal to the density of positively-charged particles (positive ions). Plasma generation may be conducted by applying power to electrodes in a chamber of a reactor. In diode or parallel plate reactors, power is applied to one electrode to generate a plasma. In triode reactors, power is typically applied to two of three electrodes to generate a plasma.

In radio frequency (RF) plasma generation, for a diode reactor, a sinusoidal signal is sent to an electrode of a pair of electrodes. Conventionally, a chuck or susceptor is the powered electrode. Examples of parallel plate reactors include the 5000MERIE from Applied Materials, Santa Clara, Calif.

A plasma source material, which typically includes one or more gases, such as, for example, argon, silane ($SiH_4$), oxygen, TEOS, diethylsilane, and silicon tetrafluoride ($SiF_4$), is directed to an interelectrode gap between the pair of electrodes. The amplitude of the RF signal must be sufficiently high for a breakdown of plasma source material. In this manner, electrons have sufficient energy to ionize the plasma source material and to replenish the supply of electrons to sustain a plasma. The ionization potential, the minimum energy needed to remove an electron from an atom or molecule, varies with different atoms or molecules.

In a typical triode reactor, three parallel plates or electrodes are used. The middle or intermediate electrode is conventionally located in between a top and bottom electrode, and thus two interelectrode cavities or regions are defined (one between top and middle electrode and one between middle and bottom electrode). The middle electrode typically has holes in it. Conventionally, both the top and bottom electrode are powered via RF sources, and the middle electrode is grounded. Examples of triode reactors are available from Lam Research, Fremont, Calif., and Tegal Corporation Ltd., San Diego, Calif.

Parallel plate and triode reactors generate capacitively coupled plasmas. These are conventionally "low density" plasmas (ion-electron density of less or equal to $10^{10}$ ions-electrons per $cm^3$) as compared with high-density (also known as "hi density") plasmas which are generated by systems such as electron cyclotron resonance (ECR) and inductively coupled plasma (ICP). For ICP systems, an inductive coil (electrode) is conventionally driven at a high frequency using an RF supply. The inductive coil and RF supply provide a source power, or top power, for plasma generation. In ECR systems, a microwave power source (for example, a magnetron) is used to provide a top power. Both ICP and ECR systems have a separate power supply known as bias power or bottom power, which may be employed for directing and accelerating ions from the plasma to a substrate assembly or other target. In either case, voltage that forms on a susceptor or chuck (also known as the direct current (DC) bias), is affected by the bottom power (RF bias); whereas, current is affected by the top power.

DESCRIPTION OF THE RELATED ART

It has been known that control of particulate contamination is imperative for cost effective, high-yielding manufacture of VLSI circuits. This control is by necessity increasing with increasingly smaller lines, feature sizes and critical dimensions being designed on such circuits. Contamination particles cause incomplete etching of work pieces such as reticules or wafers in spaces between lines, thus leading to an unwanted electrical bridge. Further, contamination particles may induce ionization or trapping centers in gate dielectrics or junctions or in reticule areas which will be used in semiconductor fabrication, leading to electrical failure of a fabricated part.

The major sources of contamination particles are personnel, equipment, and chemicals. For example, people, by shedding of skin flakes, create particles which are easily ionized and can cause defects. It is estimated that particles sized from less than 0.01 micrometers to 200 micrometers and above should be of concern during the processing of semiconductors. "Clean rooms" are typically used for semiconductor manufacture, and through filtering and other techniques, attempts are made to prevent entry of particles with sizes of 0.03 micrometers and larger. It is virtually impossible, however, to keep particles smaller than 0.03 micrometers out of a clean room.

To address the problem of semiconductor contamination, a Standard Mechanical Interface (SMIF) system was devised. The SMIF system provides a small volume of still, particle-free air, with no internal source of particles, for transporting wafers. SMIF designs are discussed in U.S. Pat. No. 5,752,796 (Muka) and U.S. Pat. No. 5,607,276 (Muka et al.).

While the SMIF system is useful for preventing particle contamination during transport of the wafers, it is wholly ineffective at preventing contamination during processing of the wafers. The SMIF containers are used during the transport of the wafers, but are removed when the wafers are placed in processing chambers for wafer processing.

Particulate contamination builds up within work piece processing chambers, such as a plasma processing chamber. This build up of contaminants must be cleansed from the processing chambers periodically. This entails considerable time and effort and requires the removal of the processing chamber from a production line. This, in turn, causes lost production time and increases costs.

There is, thus, a need in the industry for a low cost and effective method and apparatus for reducing the need to periodically clean work piece processing chambers, such as a plasma processing chamber.

SUMMARY OF THE INVENTION

The present invention provides a removable container which is inserted into a processing chamber and in which the work piece processing is carried out. The container has at least one side and a base, as well as an ingress and egress for the work piece. The container further includes one or more ports located in the side which connect with ports of the processing chamber which provide gasses or other materials used in processing. The container is made of materials allowing the container to have an effective life at least as long as the required processing, preferably allowing the container to be reused a number of times. A locking mechanism may be included to lock the container within the chamber.

The present invention also provides a system for processing a semiconductor work piece. The system includes a processing chamber and a removable container having the characteristics noted in the preceding paragraph. In one aspect of the invention, the processing chamber is a plasma processing chamber.

The present invention further provides a method of processing a semiconductor work piece in which the work piece is provided within a container, the container being removably inserted in a work piece processing chamber, with the processing being accomplished inside the container.

The invention may be used to process any work piece associated with semiconductor fabrication including, but not limited to, reticules, masks, leads, wafers, and packages.

DETAILED DESCRIPTION OF THE PREFERRED EMBODIMENTS

In the following description, the invention is described in connection with a plasma processing chamber. However, this is merely illustrative of one environment of use for the invention and the invention is not to be considered as limited to that environment. Also, the invention can be used with other work piece processing chambers. In addition, the invention is described with reference to a reticule, which is but one example of a work piece which can be processed using the invention.

Figure 1:
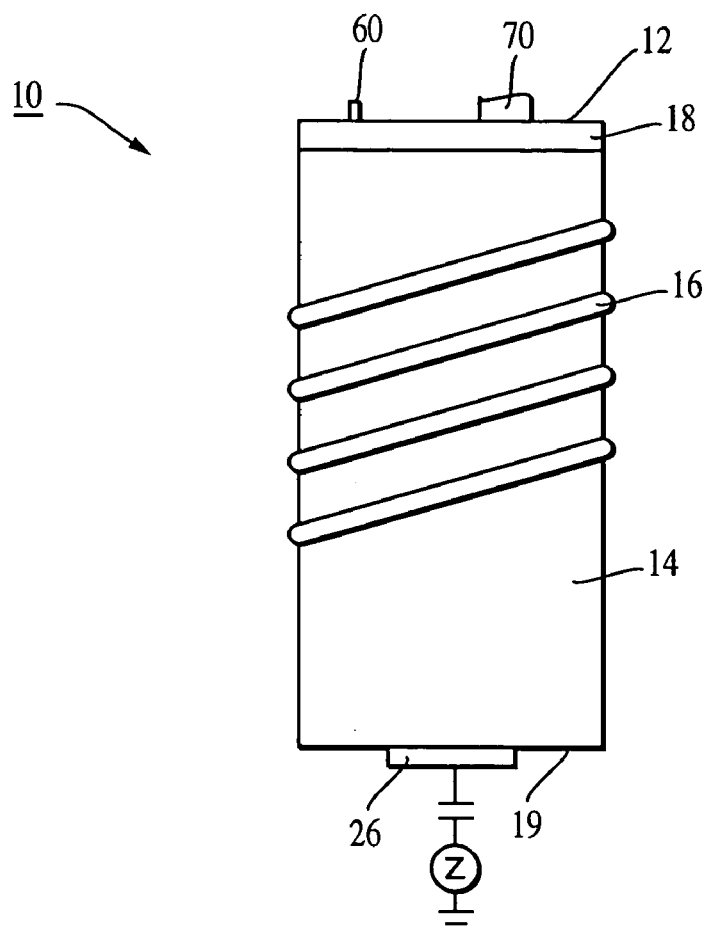
FIG. 1 is perspective view of a conventional plasma processing chamber.
Figure 2:
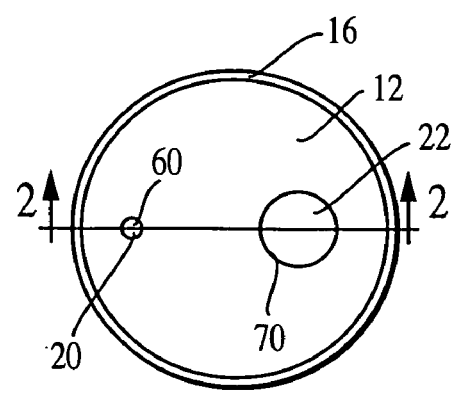
FIG. 2 is a top view of the processing chamber of FIG. 1.

Referring now to the drawings, where like numerals designate like elements, there is shown in FIG. 1 a reticule processing chamber 10. The processing chamber 10, which is shown as being generally cylindrical in shape, is an inductively coupled plasma processing chamber and includes an inductive coil 16 as an electrode wrapped around a side surface 14 thereof. The chamber 10 further includes a door 18 and an under surface 19. The door 18 is conventionally made to allow ingress and egress of wafers, or other semiconductor work pieces or integrated circuit packages, to be processed within the chamber 10. A gas port 20 and a vacuum port 22 are provided in the door 18, as shown in FIG. 2. In addition, a guiding mechanism, specifically a plurality of chamfers 15, FIG. 3, are located on an inner surface of the side 14 of the chamber 10.

As noted above, in inductively coupled plasma systems, the inductive coil, here coil 16, is driven at a high frequency using a radio frequency (RF) supply 27. Together, the coil and the radio frequency supply provide a source of power for the plasma generation. As shown in FIGS. 1, 3, a wafer, or RF, chuck 26 is provided through the under surface 19 of the chamber 10. The RF supply 27, in electrical connection to the chuck 26, drives the coil 16 at a high frequency, thereby providing the source of power for the plasma generation within the chamber 10.

Figure 3:
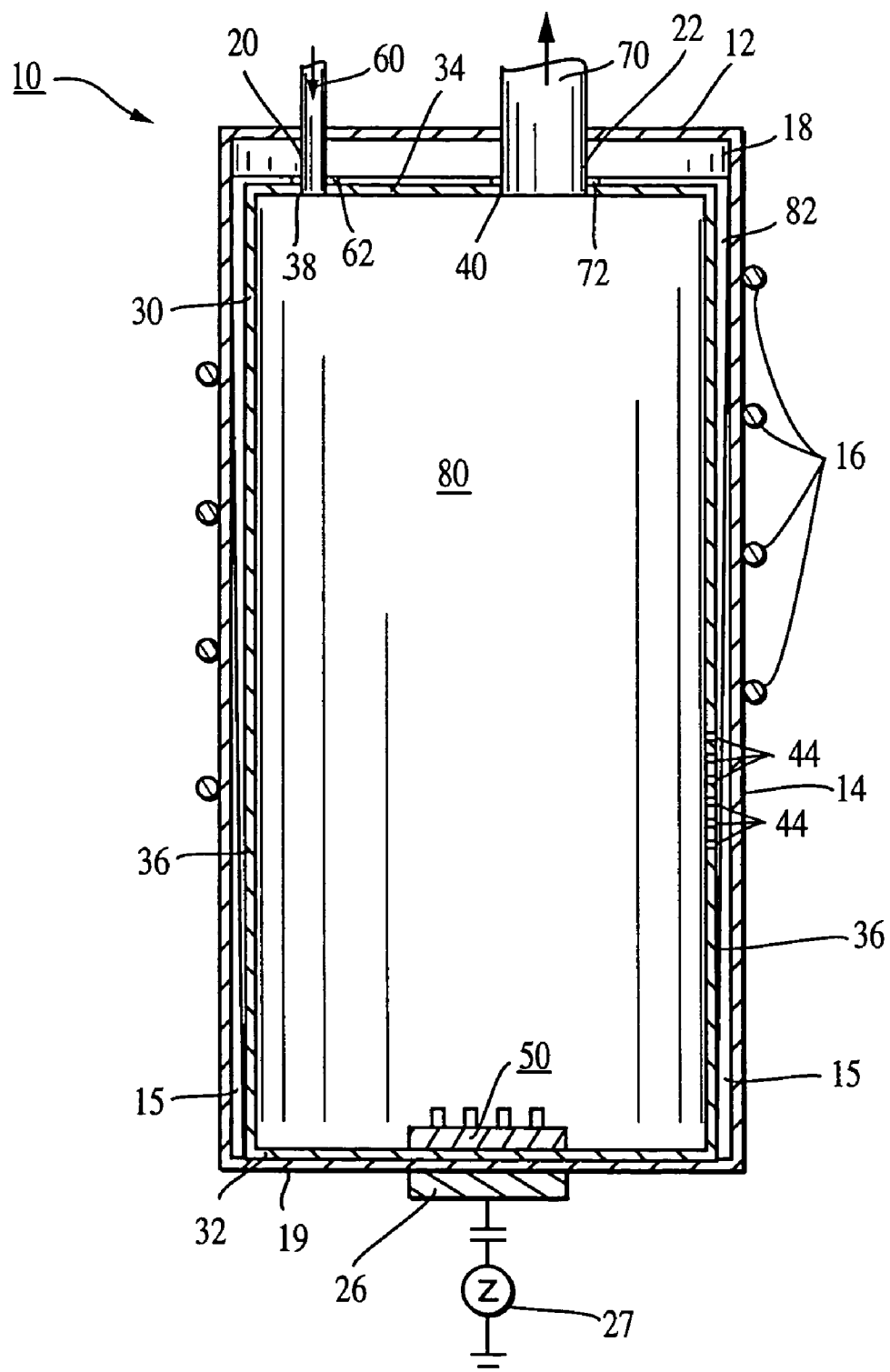
FIG. 3 is a cross-sectional view taken along line 2—2 of FIG. 2 of the chamber of FIG. 1 and a container constructed in accordance with an embodiment of the present invention.
Figure 4:
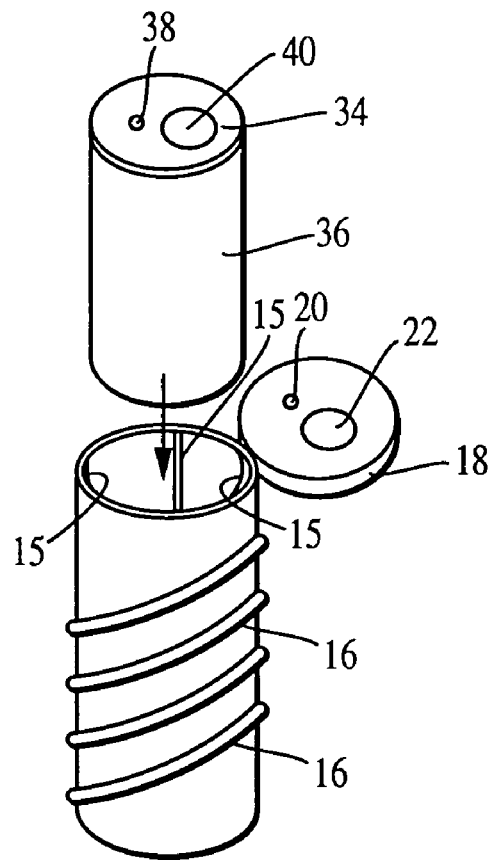
FIG. 4 is a perspective view showing the container of FIG. 3 and the chamber of FIG. 1.
Figure 5:
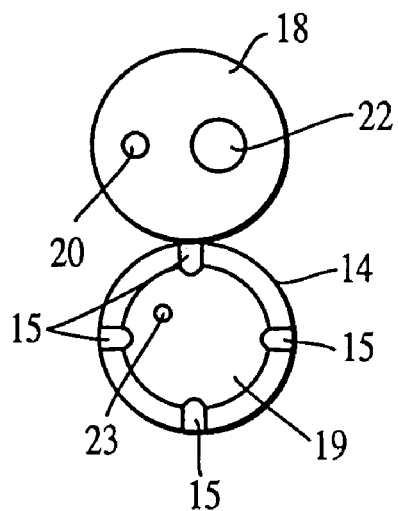
FIG. 5 is a top view of the chamber of FIG. 1 showing the interior of the chamber.

With further reference to FIG. 3, which is a cross-sectional view that has been elongated for clarity of description of the invention, a removable container, or liner, 30 is encased within the processing chamber 10. The generally cylindrical container 30 has a base 32, an upper surface 34, and a side 36. The upper surface 34 acts as a door for ingress and egress for a work piece, which is illustrated as a reticule 50. It is, however, to be understood that any type of semiconductor work piece may be used with the container 30, such as wafers, lead frames, or integrated circuit packages. The chuck 26 extends through the base 32, thereby placing a top surface of the chuck 26 (upon which a work piece to be processes will rest) within the chamber 30.

The container 30 may be formed of any suitable material which is able to withstand the environment within the processing chamber 30 for at least as long as the processing step. For example, if a conductive material is necessary, the container 30 may be formed of a conductive material. Alternatively, the container may be formed of a dielectric material, a partially conducting material, an insulative material, or a combination of these. Additionally, the container 30 may be formed of a material which would allow it to be subjected to more than one processing of a work piece, prior to being cleaned or discarded.

The upper surface 34 of the container 30 includes a gas port 38 and a vacuum port 40. The ports 38, 40 align with the processing chamber ports 20, 22 when the container 30 is positioned within the processing chamber 10.

As shown in FIGS. 1–3, a gas conduit 60 extends from the port 20 of the chamber 10. It is important that the gas ports 20 and 38 closely align. Port 20 is in sealing and fluid communication with the port 38 of the container 30. Further, a vacuum conduit 70 extends from the port 22 of the chamber 10. It is somewhat less important for the vacuum ports 22, 40 to closely align. While close alignment of the vacuum ports 22, 40 may be preferable, exerting a high speed vacuum in a closed system (the chamber 10) will pump the gas out of the container 30 even if the ports 22, 40 are not closely aligned. As shown in FIG. 3, the port 22 is closely aligned to the port 40 of the container 30. Compliant sealing members 62 and 72 are placed between the container 30 and processing chamber 10 in a space 82 and around the ports 20, 38 and 22, 40, respectively, to provide a seal preventing fluids which pass through the ports from escaping into the space 82 between the container 30 and the processing chamber 10. The conduits 60, 70 may be pipes, hoses, or any other suitable member defining an interior space.

Figure 6:
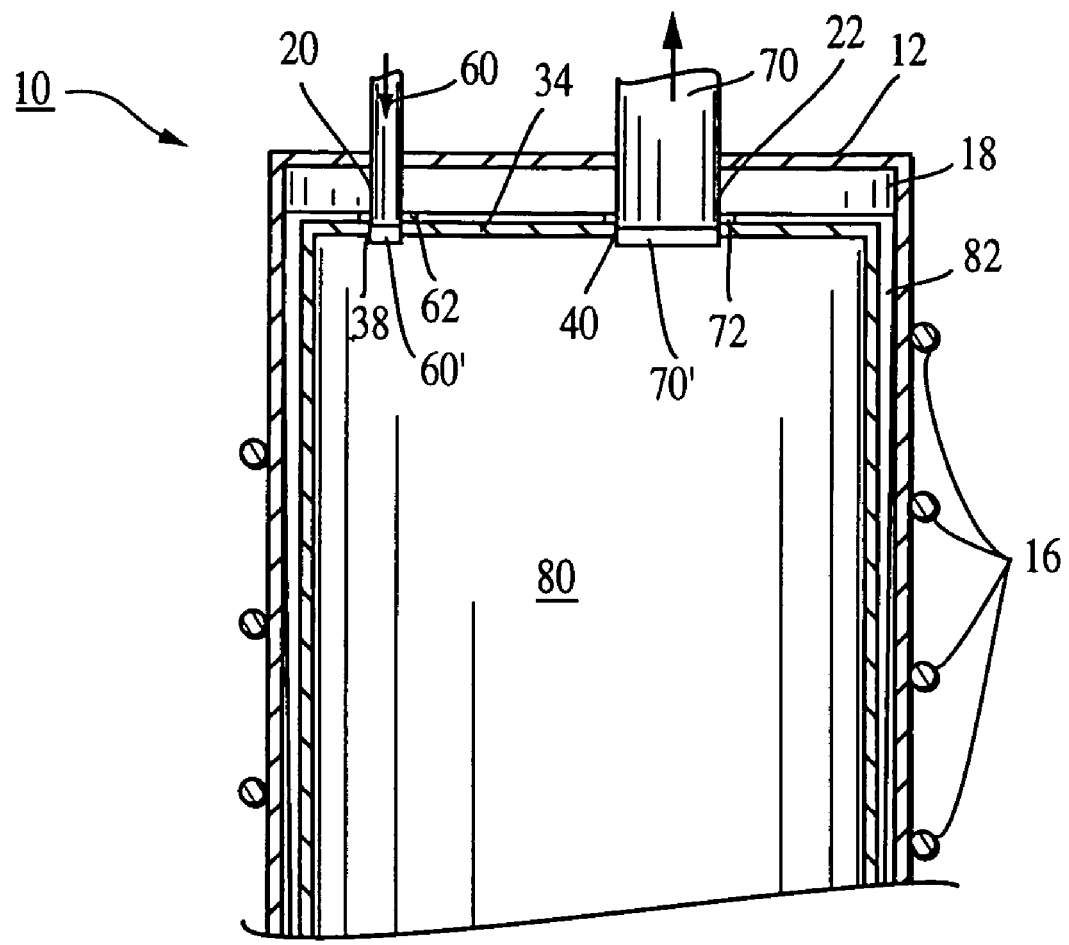
FIG. 6 is a partial cross-sectional view of a chamber and container constructed in accordance with another embodiment of the present invention.

Alternatively, with reference to FIG. 6, the gas conduit 60 and vacuum conduit 70 may only extend into the upper surface 34 of the container 30. A mating gas conduit 60' is fit within the port 38 and is adapted to mate with the conduit 60. The sealing member 62 is placed in position to seal the junction between the conduits 60 and 60'. A mating vacuum conduit 70' is fit within the port 40 and is adapted to mate with the vacuum conduit 70. The sealing member 72 is placed in position to seal the junction between the conduits 70 and 70'. The compliant sealing members 62, 72 may be any suitable seal, such as an O-ring or hose clamp. Further, the sealing members 62, 72 may not be separate sealing devices, but instead may be devices built into the hoses. For example, sealing member 62 may be a push-fit seal positioned at an end of the conduit 60 such that the conduits 60 and 60' may mate with and be sealed together through pushing the conduit 60' into the sealing member 62.

Figure 7:
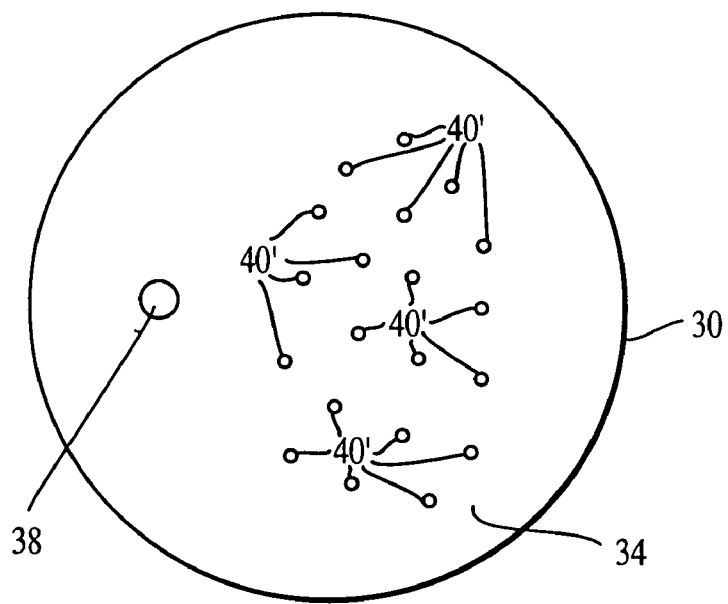
FIG. 7 is a top view of a container constructed in accordance with another embodiment of the present invention.
Figure 8:
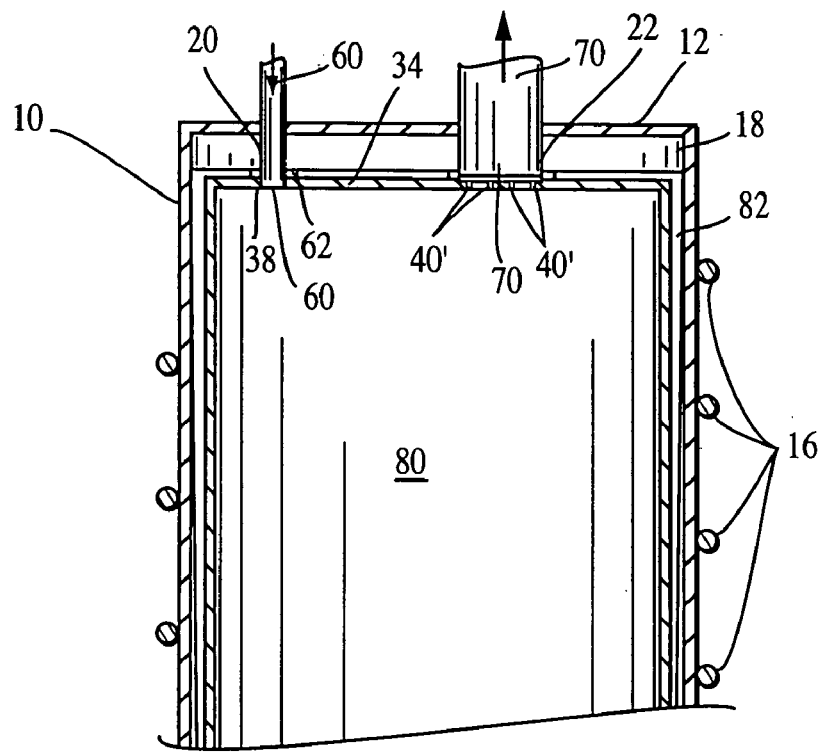
FIG. 8 is a partial cross-sectional view of a chamber and container of FIG. 7.

With reference to FIGS. 7, 8, the container 30 is shown with another aspect of the invention. To more symmetrically pump the gas and non-volatile reaction products, and thereby more efficiently clean the interior of the container 30, a plurality of vacuum ports 40' are located on the upper surface 34 of the container 30. The ports 40' spread out the vacuuming throughout the space 80 within the container 30. Thus, a more even vacuuming of the space 80 may be accomplished. The vacuum conduit 70 should be of sufficient size to encircle all of the ports 40'. As illustrated, the vacuum conduit 70 is not sealed to the upper surface 34 around the ports 40'. Alternatively, the vacuum conduit 70 may be sealed to the upper surface 34.

It is required that gas pumping, or vacuuming, speeds must be relatively high, and thus, it is necessary to provide a sufficiently large opening through which to pump the gas. Preferably, the conduit 70 should be between six and twenty inches in diameter. The ports 40', as shown in FIG. 7, should number between ten to twenty ports, each being between 0.02 and 0.04 inches in diameter. Contrarily, the size of a single gas conduit 60 need not be as large as the vacuum conduit 70. Preferably, the diameter of a single gas conduit 60 should be in the range of about 0.4 inches. The gas may be injected into the container 30 through a single gas port 38, as shown in FIG. 3, or alternatively, the gas may be injected through a multiple of smaller gas ports, much like the multiple ports 40' shown in FIG. 7. The multiple gas ports, typically called a gas distribution system or a gas showerhead, may be used to obtain greater uniformity of gas distribution within the container 30.

The container 30 may be manually placed within the chamber 10. The chamfers 15, which have an increasing radial height in a direction from the upper surface 34 to the under surface 36, assist in aligning the container 30 properly within the chamber. Robotic systems may be used to mechanically place the container 30 in the chamber 10. Examples of suitable robotic systems include those having robot arms which are pre-aligned during maintenance and those having robot arms which are self-aligning. An important aspect of the container 30 is that it protects the wafer or reticle 50 from particles contamination caused during insertion of the container 30 within the chamber 10, such as, for example, by striking one of the chamfers 15.

Figure 9:
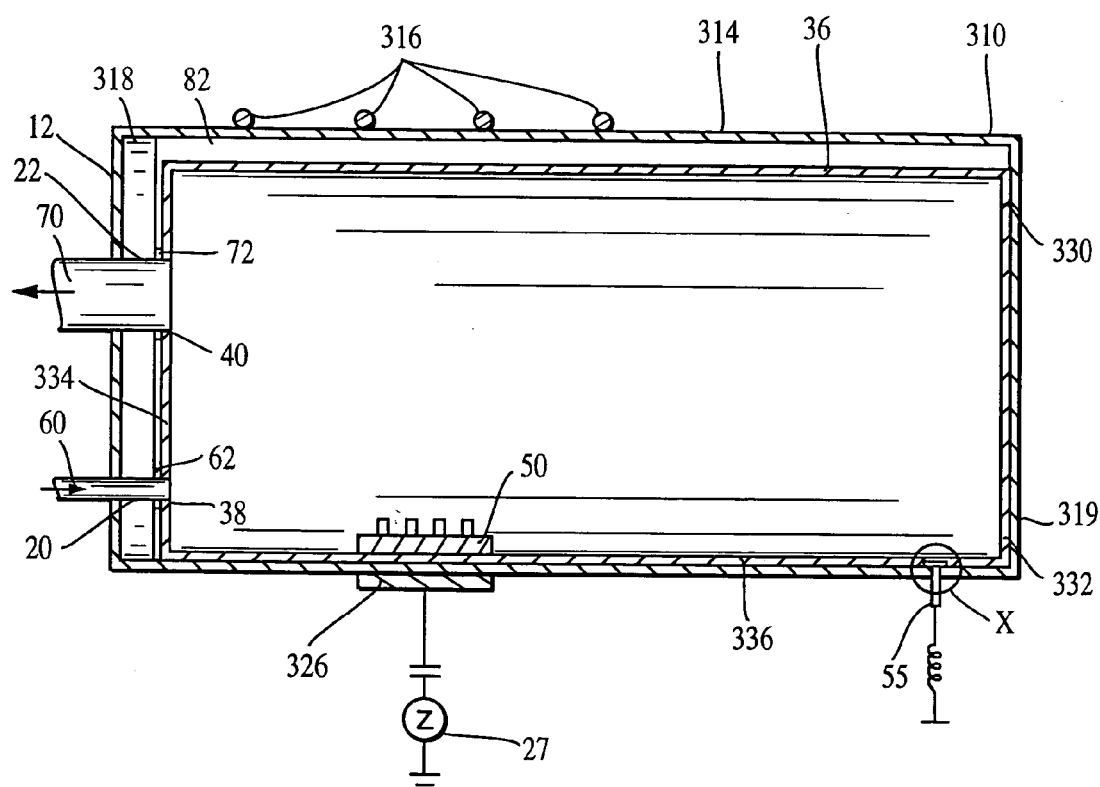
FIG. 9 is a cross-sectional view of a chamber and of a container constructed in accordance with another embodiment of the present invention.

Next will be described an alternative embodiment of the chamber 10 and the container 30 whereby they are supported horizontally. FIG. 9 shows a horizontal processing chamber 310 and a container 330; specifically, lying on a chamber side 314 and a container side 336 with a door 318, an under surface 319, an upper surface 334 and a base 332 all in a vertically directed plane. The wafer chuck 326 and the RF supply 27 are positioned under the side 314 of the chamber 310, and inductive coils 316 are positioned above the chuck 326 on the top side of the side 314. The reticle 50 is positioned above the chuck 326 when the container 330 is placed within the chamber 310.

Figure 10:
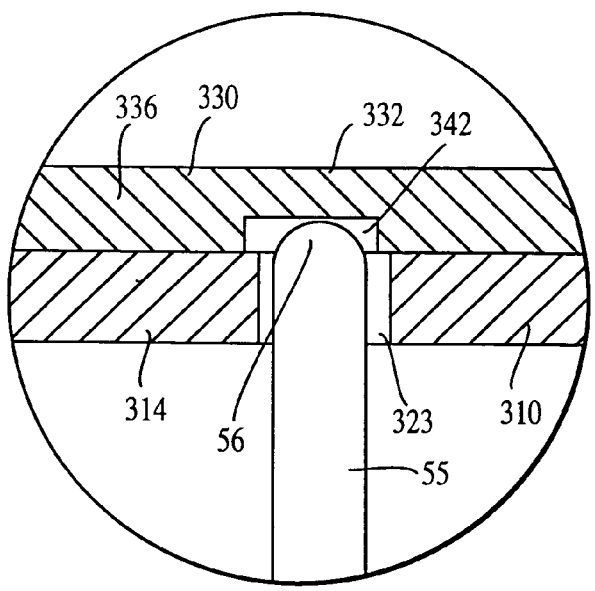
FIG. 10 is a close-up view of a locking mechanism taken within circle XI of FIG. 3.

A locking apparatus which releasably locks the container 330 to the chamber 310 is shown in FIGS. 9, 10. The locking mechanism includes a hole 323 provided through the chamber side 314 and a recess 342 provided in the container side 336. A biased locking pin 55 passes through the hole 323. The pin 55 is spring loaded and biased upwardly toward the recess 342. Further, the pin 55 has a rounded head 56 to facilitate locking. Alternatively, the pin 55 may have a tapered or angled head 56. As the container 330 is placed in the chamber 310, the container side 336 slides along the chamber side 314. Alternatively, this embodiment may include the chamfers 15, in which case the container side 336 would slide along the chamfers 15. When a portion of the container side 336 reaches the pin 55, it presses the pin 55 downwardly against the biasing force. When the recess 342 reaches the locking pin 55, the pressure pushing the pin 55 downwardly is released, allowing the pin 55 to move upwardly into the recess 342, thereby locking the container 330 into place within the chamber 310. The pin 55 may be pulled down manually, or by other means, to later unlock and release the container 330 from the chamber side 314. The recess 342 can be formed of a sufficient length to ensure that the recess 342 meets up with the pin 55.

Although the apparatus for locking the container 330 to the chamber 310 is shown as a spring-loaded locking pin 55 and a recess 342, it is to be understood that the container 330 may be locked into position within the chamber 310 in a variety of different ways. Further, although the locking mechanism has been described in terms of the FIG. 9 embodiment, it is to be understood that the locking mechanism may be included in the embodiments shown in FIGS. 3, 6, 8, 11, and 12.

Next will be described the operation of the container 30 (FIG. 3) within the chamber 10. The reticle 50 is placed within the container 30, the latter of which is guided into place within the chamber 10 by the chamfers 15. The gas conduit 60 and the vacuum conduit 70 each extend through the container 30 and are sealed thereto with, respectively, the sealing members 62, 72. Alternatively, the gas and vacuum conduits 60, 70 are mated with, respectively, the conduits 60', 70', and sealed together with the sealing members 62, 72. Gas is introduced to a space 80 within the container 30 through the gas conduit 60. Pressure within the container 30 may be equalized to the pressure in the space 82 through a plurality of pores 44 in a side 36 of the container 30. The RF supply 27 then drives the inductive coil 16. The amplitude of the RF signal from the RF supply 27 needs to be sufficiently high to interact and breakdown the gas, which acts as the plasma source material. Thus, the type of gas will have a bearing upon the amplitude of the RF signal necessary from the RF supply 27. The manner of creating a plasma, including the necessary gas compositions and RF voltages needed for desired processing conditions are well known in the art and are not described in detail herein.

As the plasma generated species react in the space 80 with the materials on the reticle 50, the vacuum introduced to the container 30 through the vacuum conduit 70 pulls volatile reaction products from the container 30. The build up of non-volatile reaction products will occur on the interior walls of the container 30.

By utilizing the container 30, less defects are deposited on the work piece during the processing. Further, the chamber 10 is not exposed to as many contaminant particles during the processing. Thus, the chamber 10 need not be wet cleaned as frequently, thus eliminating many of the re-qualifications of the chamber 10. The container 30 itself, provided it is in a good condition to be utilized again after the processing, may be cleaned and/or refurbished and used again. Otherwise, the container 30 may be discarded.

Figure 11:
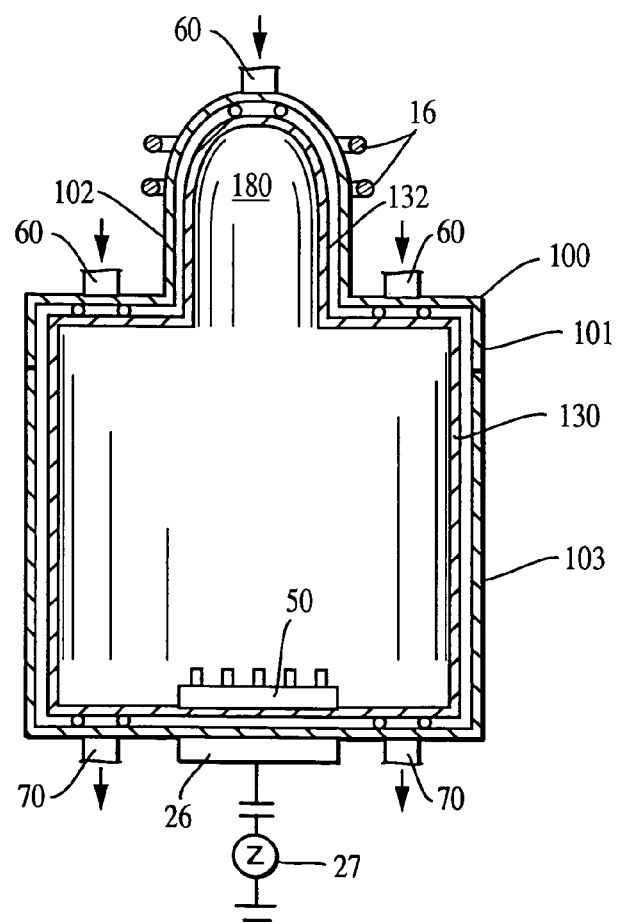
FIG. 11 is a cross-sectional view of a chamber and of a container constructed in accordance with another embodiment of the present invention.

FIG. 11 shows another preferred embodiment of the present invention. A chamber 100 and a container 130 are shown in FIG. 11. The chamber 100 is generally cylindrical and includes an upper section 101 having a dome portion 102, and the generally cylindrical container 130 likewise includes a dome portion 132 which fits within the dome portion 102. The upper section 101 of the chamber 100 may be lowered onto and secured to a lower section 103 after the container 130 is placed inside the chamber 100. A space 180 is located within the dome portion 132 and in the upper reaches of the rectangular portion of the container 130. The space 180 denotes an area within the container, like space 80, within which plasma products are formed through a reaction between the RF signal from the RF supply 27, the inductive coil 16 and the gas, which is introduced through the gas conduits 60. Vacuum conduits 70 are positioned at a lower position of the chamber 130. As with previously discussed embodiments, the conduits 60, 70 may mate with conduits 60', 70', respectively, and be sealed with sealing members 62, 72. The container 130 may be guided into the chamber 100 through a guiding mechanism, such as the previously described chamfers 15, or any other suitable guiding mechanism. The chamber 100 and the container 130 may be supported horizontally or vertically, and a releasable locking mechanism, such as the locking pin 55, may be utilized to lock the container 130 into place within the chamber 100.

Figure 12:
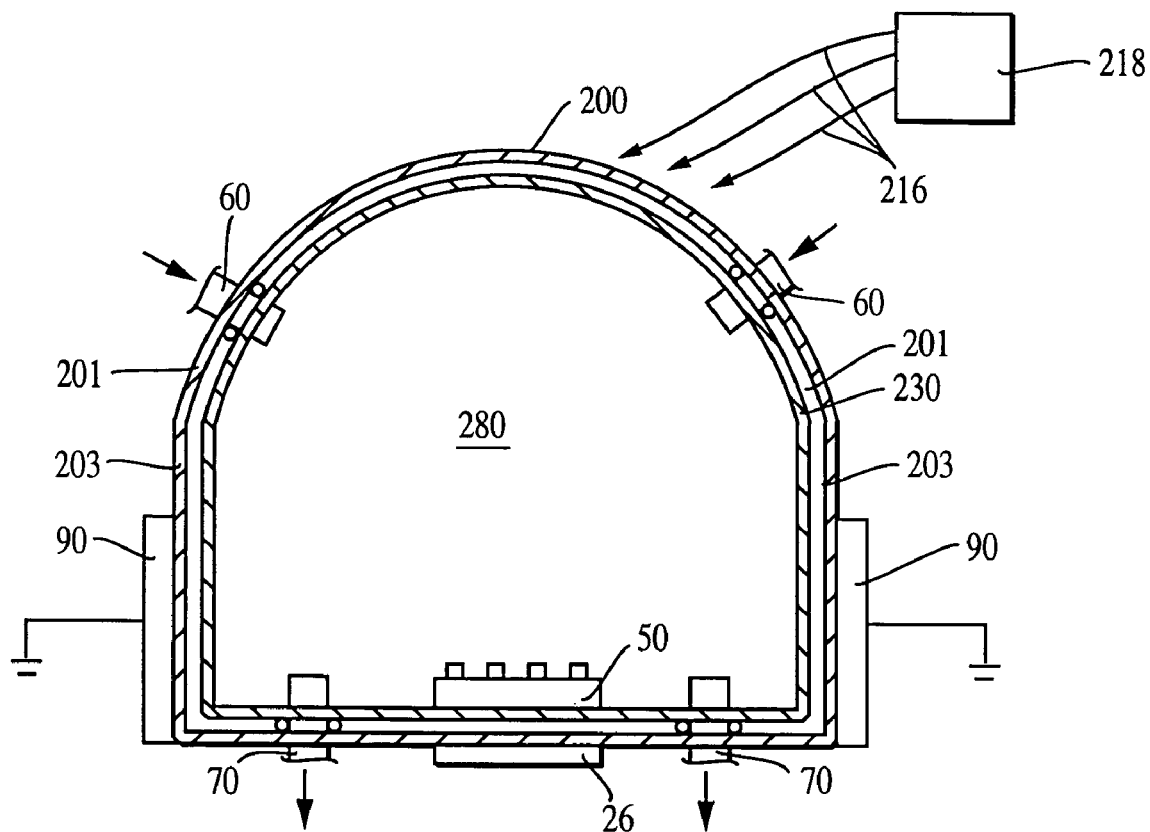
FIG. 12 is a cross-sectional view of a chamber and of a container constructed in accordance with another embodiment of the present invention.

Another preferred embodiment of the present invention is shown in FIG. 12. Here, a dome-shaped processing chamber 200 is shown encasing a dome-shaped removable container 230. The chamber 200 is a microwave-generated plasma chamber. Alternatively, it may be an electron cyclotron resonance chamber. The chamber 200 is grounded by a pair of grounding plates 90.

Unlike inductively coupled plasma chambers, such as chambers 10, 100, the chamber 200 does not utilize a coil in conjunction with an RF supply to produce plasma. Instead, the microwaves 216, from a microwave power source 218 shown schematically, provide power to generate plasma within a space 280 within the container 230. The microwave power source 218 may be any suitable source, such as, for example, a magnetron. In this embodiment, the container 230 is preferably formed of a dielectric material. The chamber 200 includes a top portion 201 which is detachable from and securable to a bottom portion 203. The top portion 201 is removed, allowing the container 230 to be placed within the chamber 200.

Modifications can be made to the invention and equivalents substituted for described and illustrated structures without departing from the spirit or scope of the invention. For example, although the container 30 has been discussed in terms of diode processing reactors, or chambers, it is to be understood that the container 30 may be used with triode reactors or any other form of chamber used to process semiconductor work pieces. Further, while certain methods of plasma generation have been discussed herein, such as inductively coupled plasma, electron cyclotron resonance, and microwave, other methods of plasma generation may be utilized in the invention, such as, for example, parallel plate etchers, diodes, magnetically enhanced reactive ion etching (MERIE), and surface wave plasma. Additionally, although two ports are shown for processing a plasma, more or less ports may be used depending on the type of processing which needs to be done. Further, although conduits 60, 60', 70, and 70' have been described for pumping gas in and out of the container 30, it is to be understood that other apparatus may be used, such as, for example, a plate having a plurality of openings positioned on a wall of the container 30 which is mated to a conduit. Accordingly, the scope of the present invention is not to be considered as limited by the specifics of the particular structure which have been described and illustrated, but is only limited by the scope of the appended claims.

What is claimed as new and desired to be protected by Letters Patent of the United States is:

1. A method of processing a workpiece, said method comprising the steps of:
    locating the workpiece in a container, said container having at least one wall, a first access door to an interior space, at least one vacuum port and a gas port;
    moving said container into a processing chamber, said processing chamber having at least one wall, a second access door to an interior space, a vacuum port and a gas port;
    processing the workpiece, said processing step comprising producing inductively coupled plasma reactions; and
    removing said container from said processing chamber.

2. The method of claim 1, further comprising cleaning said container.

3. The method of claim 2, further comprising reusing said container.

4. The method of claim 1, further comprising discarding said container.

5. The method of claim 1, further comprising:
    after moving said container into said processing chamber, aligning said processing chamber vacuum port with said container vacuum port; and
    sealing said processing chamber vacuum port and said container vacuum port.

6. The method of claim 1, wherein said step of moving said container into said processing chamber further comprises locking said container at a predetermined position within said processing chamber.

7. A method of processing a workpiece, said method comprising the steps of:
    locating the workpiece in a container, said container having at least one wall, an access door to an interior space, at least one vacuum port and a gas port;
    locking said container at a predetermined position within a processing chamber, said processing chamber having at least one wall, an access port to an interior space, a vacuum port and a gas port;
    processing the workpiece; and
    removing said container from the processing chamber.

8. The method of claim 7, further comprising cleaning and reusing said container.

9. The method of claim 7, further comprising discarding said container.

10. The method of claim 7, wherein said step of processing further comprises producing inductively coupled plasma reactions.

11. A method of processing a workpiece, said method comprising the steps of:
- locating the workpiece in a container, said container having at least one wall, a first access door to an interior space, at least one vacuum port and a gas port;
- moving said container into a processing chamber, said processing chamber having at least one wall, a second access door to an interior space, a vacuum port and a gas port;
- aligning said processing chamber vacuum port with said container vacuum port;
- sealing said processing chamber vacuum port and said container vacuum port;
- processing the workpiece; and
- removing said container from said processing chamber.

* * * * *